(12) United States Patent
Yuval

(10) Patent No.: US 7,397,665 B2
(45) Date of Patent: Jul. 8, 2008

(54) INTEGRAL HEAT-DISSIPATION SYSTEM FOR ELECTRONIC BOARDS

(75) Inventor: Yassour Yuval, Kibbutz Hasolelim (IL)

(73) Assignee: OPTHERM - Thermal Solutions Ltd., Ramat HaSharon (IL)

( * ) Notice: Subject to any disclaimer, the term of this patent is extended or adjusted under 35 U.S.C. 154(b) by 134 days.

(21) Appl. No.: 11/007,806

(22) Filed: Dec. 8, 2004

(65) Prior Publication Data

US 2006/0120039 A1 Jun. 8, 2006

(51) Int. Cl.
*H05K 7/20* (2006.01)
(52) U.S. Cl. ............... 361/719; 361/694; 361/695; 361/699; 361/701; 361/702
(58) Field of Classification Search ......... 361/694–695, 361/699, 701–702, 711, 719–721
See application file for complete search history.

(56) References Cited

U.S. PATENT DOCUMENTS

| | | | | |
|---|---|---|---|---|
| 5,316,077 A * | 5/1994 | Reichard | ............... | 165/104.28 |
| 5,508,883 A * | 4/1996 | Lumbra et al. | ............... | 361/697 |
| 6,377,457 B1 * | 4/2002 | Seshan et al. | ............... | 361/690 |
| 6,496,370 B2 * | 12/2002 | Geusic et al. | ............... | 361/699 |
| 6,781,831 B1 * | 8/2004 | Banton et al. | ............... | 361/690 |
| 6,999,314 B2 * | 2/2006 | Tonosaki et al. | ........... | 361/700 |
| 7,009,842 B2 * | 3/2006 | Tilton et al. | ................. | 361/699 |
| 7,019,971 B2 * | 3/2006 | Houle et al. | ................ | 361/699 |
| 7,110,258 B2 * | 9/2006 | Ding et al. | ................. | 361/699 |
| 2005/0047090 A1 * | 3/2005 | Tonosaki et al. | ........... | 361/700 |
| 2005/0128706 A1 * | 6/2005 | Maly et al. | ................. | 361/699 |

\* cited by examiner

*Primary Examiner*—Gregory D Thompson
(74) *Attorney, Agent, or Firm*—Pearl Cohen Zedek Latzer, LLP

(57) ABSTRACT

A system of at least one integrated electronic board device with integral cooling system. The device comprises an integrated electronic board, with a plurality of heat-dissipating electronic components distributed over it, with heat-exchanging devices coupled to the heat-dissipating electronic components, and a plurality of slots provided adjacent each of the plurality of heat-dissipating electronic components. Each slot fluidically communicates with a heat-exchanging device. An adjoining cover defining, with the integrated electronic board, a cavity for providing an integral reservoir between the slots and at least one port that may be connected to a flow generator for generating a flow of a fluidic coolant through said at least one of a plurality of heat-exchanging devices.

28 Claims, 9 Drawing Sheets

INTEGRAL HEAT-DISSIPATION SYSTEM FOR ELECTRONIC BOARDS

FIELD OF THE INVENTION

The present invention relates to cooling (or heating) systems. More particularly the present invention relates to an integral heat-dissipation system for electronic boards.

BACKGROUND OF THE INVENTION

The continuing reduction in size of microelectronic components, such as chips, diodes, laser sources and other such devices, and the reduction in transistor rise time, presents a formidable challenge to the packaging industry. In order to facilitate effective near-term utilization of the future microelectronic devices, the design and performance of first and second level packaging need a significant improvement with respect to the current state-of-the-art cooling technologies. Heat dissipation of various microelectronic devices exceeding 100 watts per $cm^2$ and more is currently being considered in the art.

Various solutions for cooling microelectronic devices had been suggested in the literature and are known in the art. The following are examples of air-cooling systems.

In U.S. Pat. No. 4,447,842 (Berg) finned heat exchangers for electronic chips and cooling assembly were introduced. It features a pair of heat exchange fins mounted on the electronic chip, each projecting through a groove and into a channel of a cooling module, and kept in contact with a cooling surface of that module.

In U.S. Pat. No. 4,535,386 (Frey et. al.) a natural convection cooling system for electronic components was disclosed. The electronic components were to be mounted at the base of an enclosure, at an opening of an inner chimney, which separates the interior of the enclosure into forward and rearward compartments. The inner chimney serves to duct the heated air rising from the electronic components to the top of the enclosure. A heat exchanger is placed at the top of that enclosure, to cool the heated air, resulting in a cooler air movement downwardly, and thus establishing natural air turbulence within the enclosure.

Another cooling system was introduced in U.S. Pat. No. 4,158,875 (Tajima et. al.). In this patent the air cooling of the electronic components is achieved by a double-walled duct construction whereby air, as a coolant, is introduced, in a direction at high angles to the length of the heat generating electronic components.

In U.S. Pat. No. 4,837,663 (Zushi et. al.) a cooling system for an electronic apparatus was disclosed. It included a plurality of motherboards, each having a circuit board to be cooled, a blower for causing airflow, and a duct for directing the airflow between the motherboards.

To-date common cooling systems are not efficient enough when higher rates of heat dissipation from electronic components are considered, and as technology procedes to introduce micro electronic devices with higher performance parameters, with subsequently higher heat dissipation, there is a growing need for more efficient cooling systems. In U.S. Ser. No. 10/893,568 (Yassour, not yet published, incorporated herein by reference) there was disclosed a heat-exchanging device comprising a block made from a heat-conducting material with a plurality of cooling tubes whose inlets and outlets are distributed on an active surface, which is substantially opposite a heat-transfer surface placed adjacent a heat-dissipating electronic component. Each cooling tube is designed to direct a coolant fluid towards and then away from the heat-transfer surface, thus when coolant fluid passes through the cooling tubes it absorbs heat from the block and evacuates it away. The heat-exchanging device disclosed in that patent application appears to be dealing with the evacuation of heat locally rather than on a grand scale, thus achieving substantially greater efficiency over conventional electronic components cooling systems, which are generally of the grand-scale type.

It is a purpose of the present invention to provide a cooling system suitable for cooling a plurality of heat-dissipating electronic components residing on a single electronic board, or on a system of grouped electronic boards.

Another object of the present invention is to provide such a cooling system that is integral to that electronic board or group of boards.

Further objects and advantages of the present invention will become apparent after reading the present specification and claims and reviewing the accompanying drawings.

SUMMARY OF THE INVENTION

There is thus provided, in accordance with some preferred embodiments of the present invention, a system of at least one integrated electronic board device with integral cooling system, the device comprising:

an integrated electronic board, with at least one of a plurality of heat-dissipating electronic components distributed over it, with heat-exchanging devices coupled to the heat-dissipating electronic components, and at least one of a plurality of slots provided adjacent each of said at least one of a plurality of heat-dissipating electronic components, each of said at least one of a plurality of slots fluidically communicating with a heat-exchanging device;

an adjoining cover defining, with the integrated electronic board, a cavity for providing an integral reservoir between the slots and at least one port that may be connected to a flow generator for generating a flow of a fluidic coolant through said at least one of a plurality of heat-exchanging devices.

Furthermore, in accordance with some preferred embodiments of the present invention, the flow generator is a vacuum source that maintains in the cavity pressure that is lower than ambient pressure.

Furthermore, in accordance with some preferred embodiments of the present invention, the flow generator is a pressurized air source that maintains in the cavity pressure above ambient pressure.

Furthermore, in accordance with some preferred embodiments of the present invention, the adjoining cover is an integrated electronic board with at least one of a plurality of heat-dissipating electronic components distributed over it, with heat-exchanging devices having a plurality of coupled to the heat-dissipating electronic components, and at least one of a plurality of slots provided adjacent each of said at least one of a plurality of heat-dissipating electronic components, each of said at least one of a plurality of slots fluidically communicating with a heat-exchanging device, and wherein the slots of the adjoining cover are fluidically connected to the cavity.

Furthermore, in accordance with some preferred embodiments of the present invention, the system comprises more than one integrated electronic board device, the port of each device connected to a shared flow generator.

Furthermore, in accordance with some preferred embodiments of the present invention, the port of each device is connected via a shared manifold to the shared flow generator.

Furthermore, in accordance with some preferred embodiments of the present invention, the heat-exchanging device comprises a heat-conductive body provided with conduits through the body, fluidically communicating with at least one slot.

Furthermore, in accordance with some preferred embodiments of the present invention, the conduits are communicating through a manifold with said at least one slot.

Furthermore, in accordance with some preferred embodiments of the present invention, at least some adjacent heat-dissipating electronic components share a single heat exchanger device.

Furthermore, in accordance with some preferred embodiments of the present invention, at least some adjacent heat-dissipating electronic components share a single slot.

Furthermore, in accordance with some preferred embodiments of the present invention, the system is further provided with a flow generator.

Furthermore, in accordance with some preferred embodiments of the present invention, the flow generator is a vacuum pump.

Furthermore, in accordance with some preferred embodiments of the present invention, the flow generator is a pressurized air pump.

Furthermore, in accordance with some preferred embodiments of the present invention, said at least one port is provided on a side wall.

Furthermore, in accordance with some preferred embodiments of the present invention, said at least one port is provided perpendicular to said device.

Furthermore, in accordance with some preferred embodiments of the present invention, more than one slot is provided adjacent a heat-dissipating electronic component, all of which are communicating with a heat-exchanging device coupled to that heat-dissipating electronic component.

Furthermore, in accordance with some preferred embodiments of the present invention, said more than one slot are provided on more than one side of the heat-dissipating electronic component.

Furthermore, in accordance with some preferred embodiments of the present invention, there is provided a method of cooling heat-dissipating electronic devices, the method comprising:

providing a device comprising an integrated electronic board, with at least one of a plurality of heat-dissipating electronic components distributed over it, with heat-exchanging devices having a plurality of coupled to the heat-dissipating electronic components, and at least one of a plurality of slots provided adjacent each of said at least one of a plurality of heat-dissipating electronic components, each of said at least one of a plurality of slots fluidically communicating with a heat-exchanging device;

providing an adjoining cover defining, with the integrated electronic board, a cavity for providing an integral reservoir between the slots and at least one port that may be connected to a flow generator for generating a flow of a fluidic coolant through said at least one of a plurality of heat-exchanging devices; and using the flow generator to drive a fluidic coolant through the heat-exchanging devices.

BRIEF DESCRIPTION OF THE DRAWINGS

In order to better understand the present invention, and appreciate its practical applications, the following Figures are provided and referenced hereafter. It should be noted that the Figures are given as examples only and in no way limit the scope of the invention. Like components are denoted by like reference numerals.

DETAILED DESCRIPTION OF PREFERRED EMBODIMENTS

The present invention generally relates to a heat-exchanging device, aimed in particular at cooling a plurality of heat-dissipating electronic components (such as PC CPUs and main-frames or server's CPUs, electro-optic component that waste heat at small area and other heat-dissipating electronic components), mounted on an electronic board, or on a cluster of electronic boards. Hereafter we shell refer only to cooling missions although the heat exchanger of the present invention may be implemented for heating missions too.

A main aspect of the present is the provision of an integrated cooling system collaborating with an electronic board with one or more heat-dissipating electronic components.

Another aspect of the present invention is the provision of a central cooling system making use of a broad air passage integrated with the electronic board, and with slots provided on the board, for connecting the cooling system to heat-exchanging devices placed over the heat-dissipating electronic components, through which air (or other fluidic—preferably gaseous—coolant) is passed. This passage may take as much as the entire space beneath the board. Hereinafter, the broad air passage is referred to as "the integral reservoir".

Yet another aspect of the present invention is the connection of the integral reservoir of the cooling system integrated with the electronic board to a vacuum source, sucking fresh air from the surroundings of the heat-dissipating components through the heat exchanging devices (where that air absorbs the dissipated heat) and evacuating it away. This arrangement brings about the option to evacuate the hot-air to the outdoor environment.

Another aspect of the present invention is alternatively connecting the integral reservoir of the cooling system integrated with the electronic board to a pressurized air source (or other fluidic, preferably gaseous, coolant), thus pumping cold air through the heat-exchanging devices, and releasing the hot air (as it absorbs heat from the system) to the surrounding atmosphere.

Still another aspect of the present invention is the provision of an integral cooling system cooperating with a cluster of several electronic boards (stacked or otherwise arranged) of an electronic system.

Figure 1:
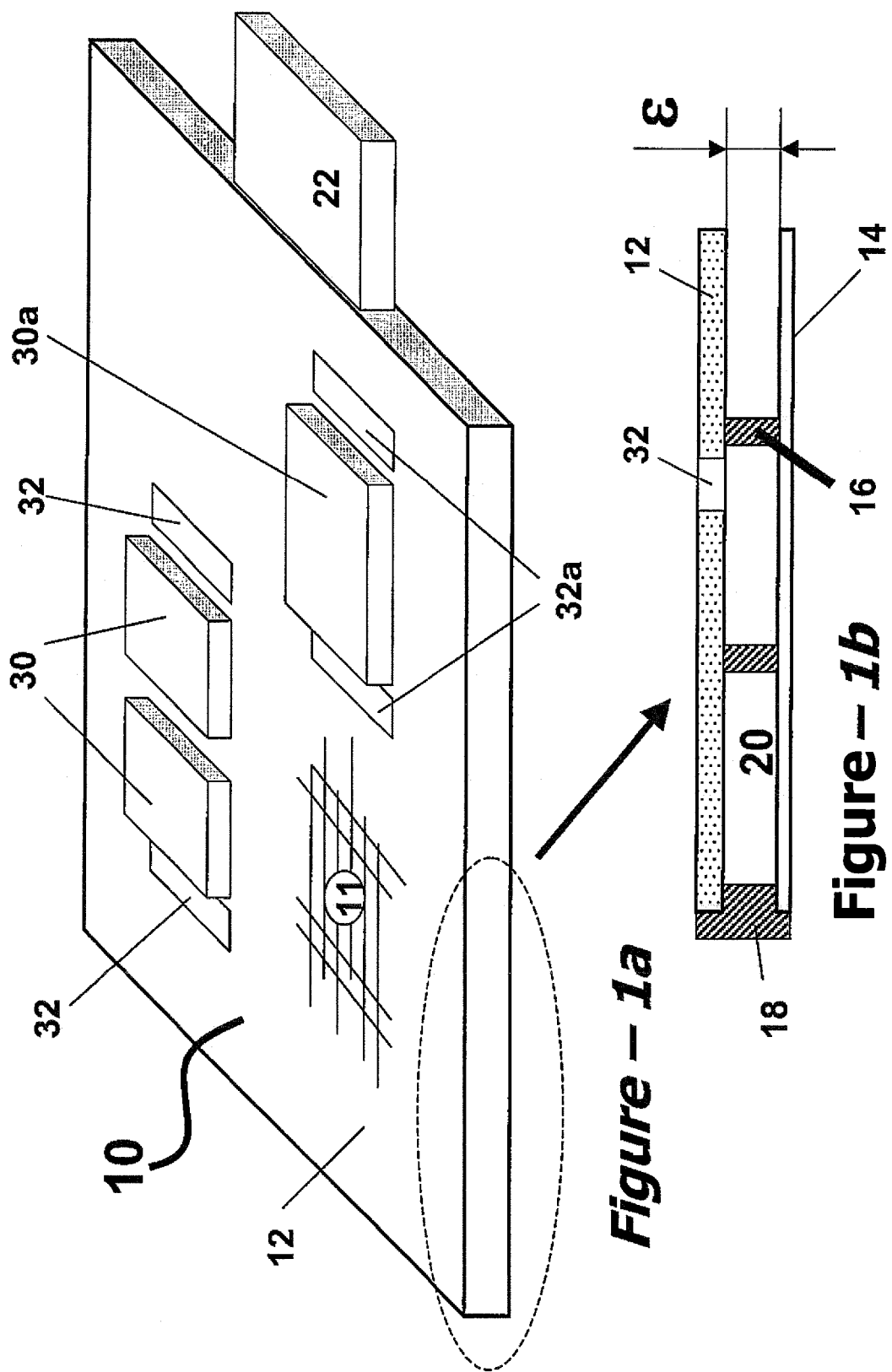
FIG. 1a illustrates an elevated view of a two-layered electronic board carrying a plurality of heat-dissipating electronic components, with an integrated cooling system, in accordance to a preferred embodiment of the present invention (heat-exchanging devices that are mounted on each or some of the electronic components are omitted—see FIG. 2).
FIG. 1b illustrates a cross-sectional view of a sector of the two-layered electronic board shown in FIG. 1a (indicated by the dashed ellipse shown in FIG. 1a).
Figure 2:
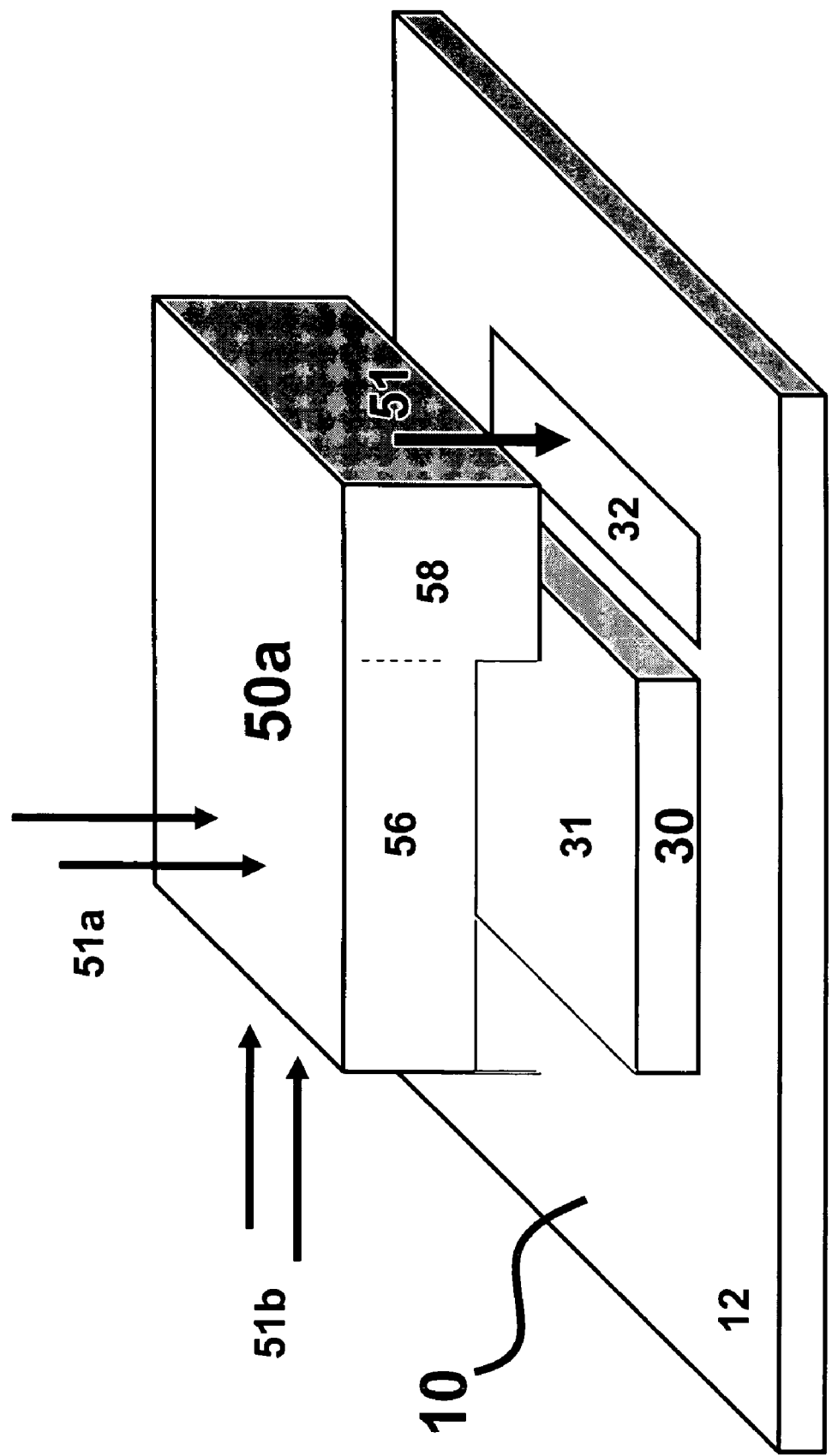
FIG. 2 illustrates an exploded view of a heat-exchanging device mounted over a heat-dissipating electronic component, located on an electronic board with an integrated cooling system, in accordance to a preferred embodiment of the present invention. The heat-exchanging device is linked to a reservoir of vacuum, which sucks ambient air through the heat-exchanger device and evacuates the hot air.

Reference is now made to FIG. 1a illustrating an elevated view of an electronic board carrying a plurality of heat-dissipating electronic components, wit an integrated cooling system, in accordance to a preferred embodiment of the present invention (heat-exchange units that are mounted on each or some of the electronic components are omitted—see FIG. 2). The integrated electronic board (IEB) 12 includes a Printed Circuits Board (PCB) 12, characterized by a grid of electrically conductive connections 11 printed on it, with several heat-dissipating electronic components 30, 30a distributed over it. The board also includes slots 32 (see FIG. 1b). The slots 32 will be referred to hereafter as feeding slots 32. Feeding slots 32 are located in the vicinity of the electronic components aimed at fluidically connecting the heat-exchanging devices with integral cavity or integral reservoir 20 (see FIG. 1b). At least one port 22 is provided, fluidically connected to integral reservoir 20, for connecting the integral cooling system to a source of pressurized air, or to a vacuum source.

FIG. 1b illustrates a cross-sectional view of a sector of the integral electronic board 10 shown in FIG. 1a (indicated by the dashed ellipse shown in FIG. 1a). The board 10 is actually made from two parallel plates, one board 12 being the printed circle board onto which the electronic components are mounted, whereas the opposite board 14 serves as a cover. In some preferred embodiments of the present invention the second plate may too be a PCB. The integral reservoir 20 of electronic board 10 is defined between boards 12 and 14. Boards 12 and 14 are not perforated (other than slots 32). The integral reservoir 20 is surrounded by sealed side walls 18 confining a closed cavity defining the integral reservoir. A plurality of spacers 16 are preferably provided to support both boards and substantially maintain the gap $\epsilon$ within predetermined tolerances of the particular design. Typically, the gap $\epsilon$ is recommended to be, for most IEB applications, in the range of 2-12 mm with respect to the overall heat-generation of the electronic components on board 10, but this is indeed not a limitation on the scope of the invention, only a recommendation. The spacers may be rigid or exhibit some flexibility allowing a little relative motion between the boards, but must ensure the existence of the integral reservoir 20 between the boards 12 and 14. It is imperative that the integral reservoir 20 of board 10 is sealed so as to prevent air from escaping (other than through the air-supply ports or the feeding-slots).

FIG. 2 illustrates an exploded view of a heat-exchanging device 50a mounted over a heat-dissipating electronic component 30, located on an electronic board 12 of the integrated board 10 of an integrated cooling system, in accordance to a preferred embodiment of the present invention. The heat-exchanging device 50a is thermally in contact with the heat-dissipating component 30 thus heat flux is well established at the contact plane 31 between 30 and 50a. It has to be emphasized that the heat exchanger device can be larger than the heat-dissipating component 30 below it and in such a case heat-spreader made of thermally conductive material may be used. The heat-exchanging device 50a is essentially made of thermally conductive material. It is linked to a vacuum source, which sucks air through the heat-exchanging device 50a and evacuates it away. The heat exchanging device 50a (here comprised of body 56 and main manifold 58) is mounted over electronic component 30 and fluidically connected to slot 32, communicating with a integral reservoir 20 (see FIG. 1b) communicating with a vacuum source. When the vacuum source is engaged to 20, air from the upper surface 51a of 50a, and/or from the sides 51b of 50a is sucked (51) through internal passages at the body 56 of the heat-exchanging device 50a, thus absorbing heat from the heat-dissipating component. The hot-air is collected via manifold 58 and evacuated through feeding slot 32. Further downstream, the hot air is preferably evacuated into the outer ambient atmosphere (usually electronic boards are packaged in cabinets and it becomes available, by this vacuum driven integral cooling system, to evacuate the hot air outside the cabinet, or, more preferably, to evacuate the hot air to outdoor environment and to save air-conditioning needs for keeping the internal space at a desired temperature). Without derogating generality, typical vacuum level at the integral reservoir can be 10 millibars or less, below atmospheric pressure.

Figure 3:
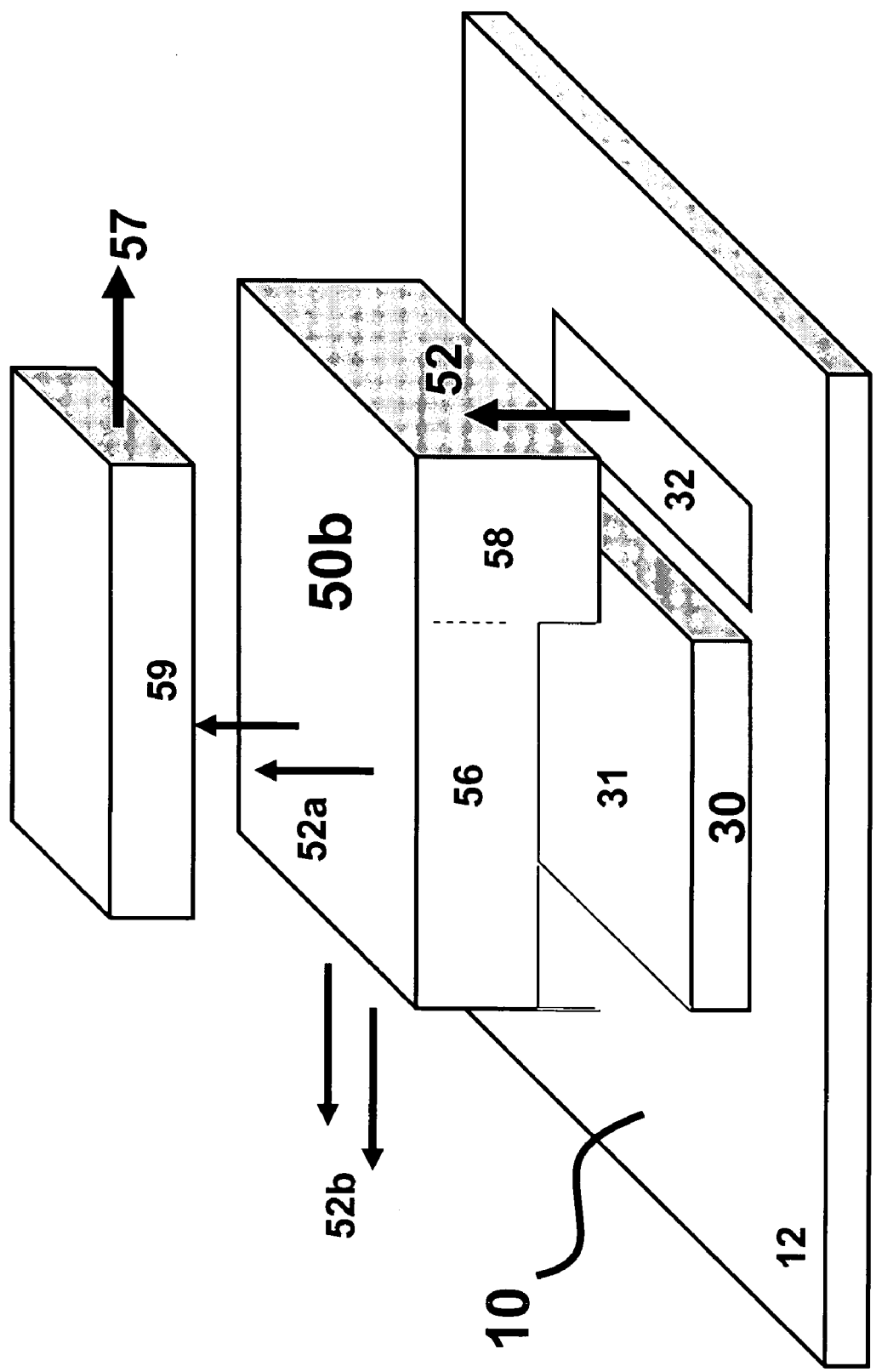
FIG. 3 illustrates an exploded view of a heat-exchanging device mounted over a heat-dissipating electronic component, located on an electronic board with an integrated cooling system, in accordance to another preferred embodiment of the present invention. The heat-exchanging device is linked to a reservoir of pressurized air, which pumps air through the heat-exchanger device into the air surrounding the board.

FIG. 3 illustrates an exploded view of a heat-exchanging device 50b similar to the device (50a) presented in FIG. 2 mounted over a heat-dissipating electronic component 30, located on an electronic board 12 with an integrated cooling system 10, in accordance to another preferred embodiment of the present invention. The heat-exchanging device 50b is linked through the feeding slots 32 to a the integral reservoir 20 (see FIG. 1b) through which fresh pressurized air is supplied. When an air pump is engaged to integral reservoir 20, fresh air from flows (52) towards the heat exchanging device 50b. Downstream, the air is driven by the pressure gradient and flows through internal passages created in body 56 of the heat-exchanging device 50a, thus absorbing heat from the heat-dissipating component 50b. The hot air is released to the surrounding atmosphere through the upper surface 52a of 50b, and/or from sides 52b of 50b. In some application it is preferable to connect the hot air coming out of 50b to a collecting pipe line 59 to allow the evacuating 57 of the hot air far away from the electronic system, preferably out of the hosting cabinet and in particular to evacuate it to outdoor environment.

Without derogating generality, typical level of pressure at the integral reservoir can be 10 millibars or less above atmospheric pressure.

Figure 4:
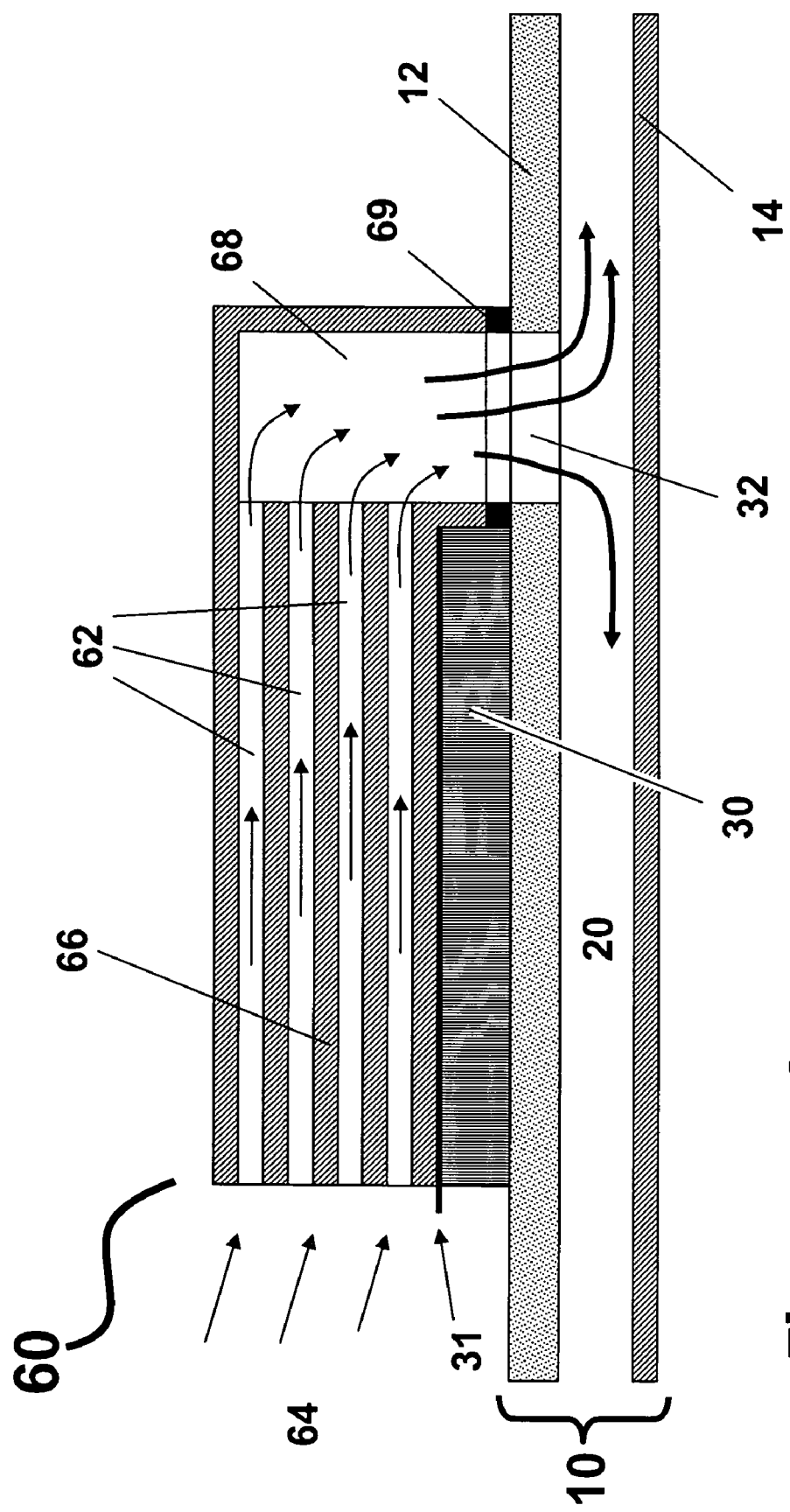
FIG. 4 illustrates a schematic cross-sectional view of one type of the types of heat-exchanging devices that may be used in collaboration with an electronic board with an integrated cooling system, in accordance to another preferred embodiment of the present invention, linked to a vacuum reservoir (see also FIG. 2).

FIG. 4 schematically illustrates a cross-sectional view of an example (60) of the types of heat-exchanging devices that may be used in collaboration with an integral cooling system of electronic board 10, in accordance to another preferred embodiment of the present invention. The heat-exchanging device 60 has a plurality of conduits 62 as seen in the body 66 of device 60. Conduits 62 are provided substantially in parallel to the contact plane 31 of the heat-dissipating component 30. Fresh ambient air is sucked (64) from a side wall of 60 and on the exit side of 62 the hot air is collected by the internal main manifold 68 of 60. Further downstream the hot air flows through feeding slot 32 to the integral reservoir 20 connected to the vacuum source. Gasket 69 ensures no leakage occurs.

Figure 5:
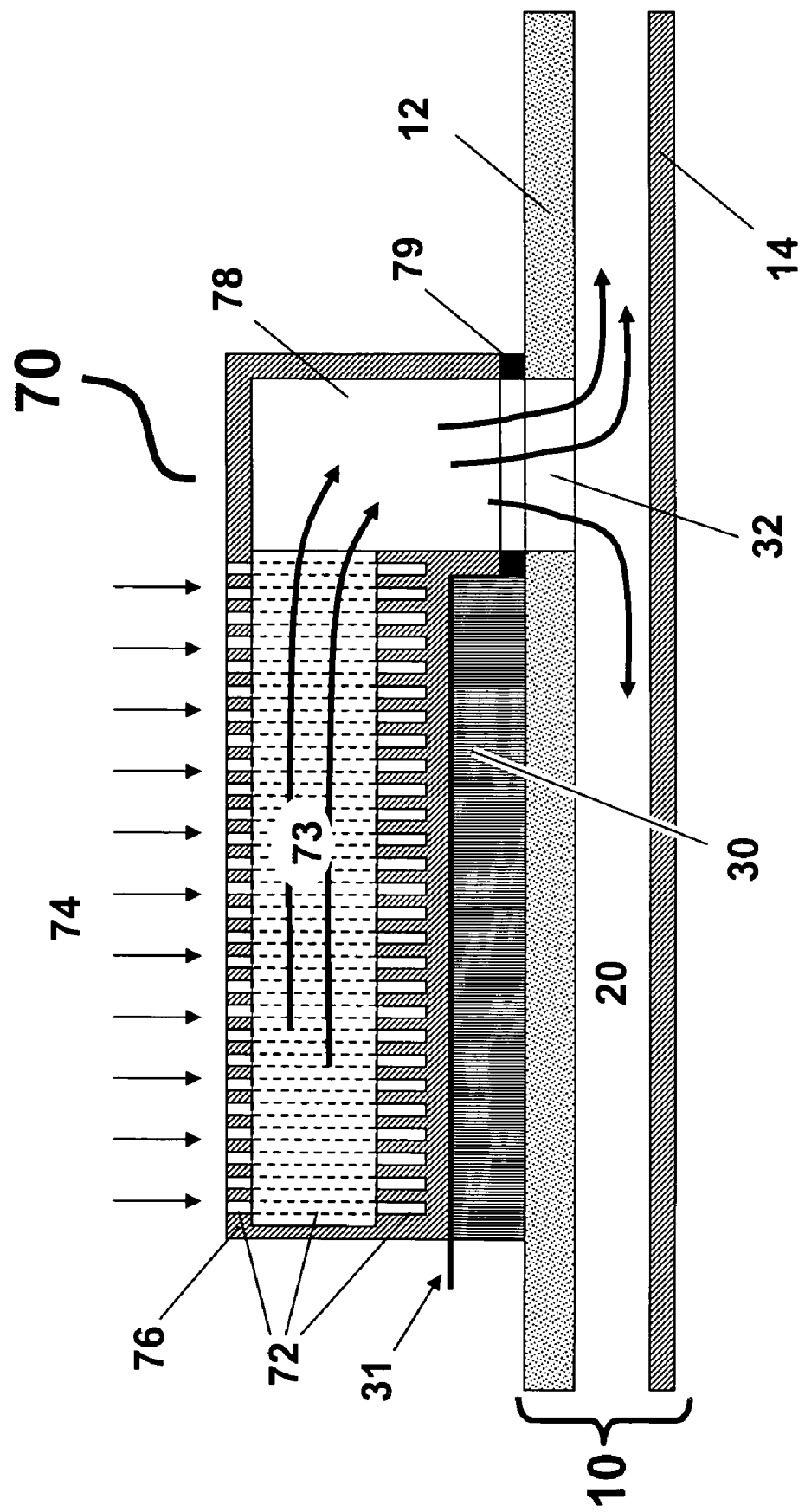
FIG. 5 illustrates a schematic cross-sectional view of another type of the types of heat-exchanging devices that may be used in collaboration with an electronic board with an integrated cooling system, in accordance to another preferred embodiment of the present invention, linked to a vacuum reservoir (see also FIG. 2).

FIG. 5 schematically illustrates a cross-sectional view of another type of heat-exchanging devices that may be used in collaboration with an integral electronic board 10 of an integrated cooling system, in accordance to another preferred embodiment of the present invention. The heat-exchanging device 70 has a plurality of conduits 72 as seen in body 76. Conduits 72 are of "U" or "J" shaped, provided substantially in vertical orientation with respect to the contact plane 31 between device 70 and the heat-dissipating component 30. Fresh ambient air is sucked (74) by conduits 72 from the upper surface of 70, the air then flows through conduits 72 downwards towards the contact plane 31, turns back upwards and through exits 72 that are fluidically connected to a plurality of parallel (to plane 31) fine integral manifolds 73 that are created between rows of conduits 72. The hot-air from 73 is collected by the internal main manifold 78. Further downstream the hot air flows through the feeding slot 32 to the integral reservoir 20 communicating with the vacuum source. Gasket 79 ensures no leakage occurs. The heat-exchanging device shown here is of the type disclosed in U.S. Ser. No. 10/893,568 (Yassour, not published yet), incorporated herein by reference.

Figure 6:
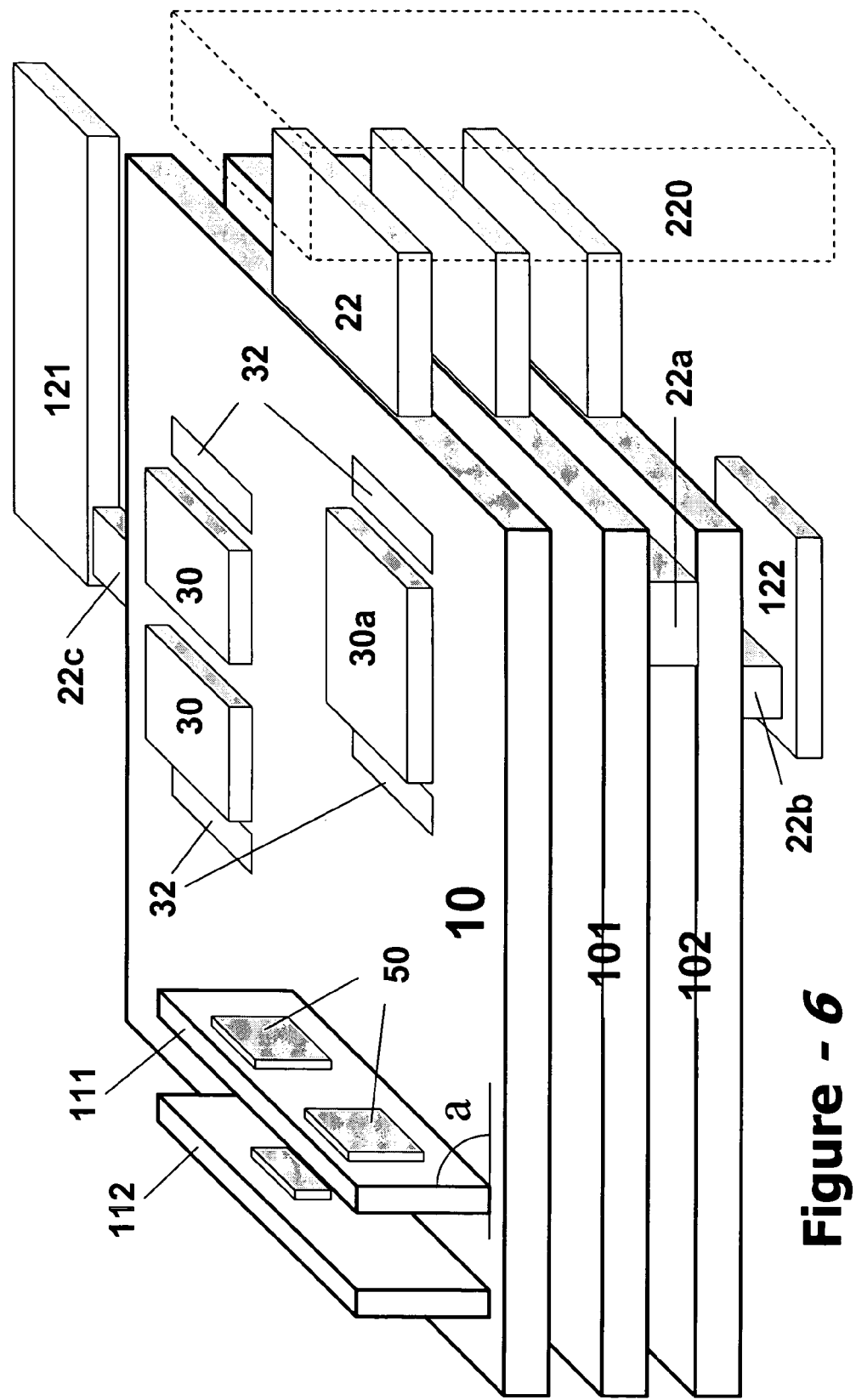
FIG. 6 illustrates an integrated cooling system for a stack of electronic boards, in accordance with another preferred embodiment of the present invention.

FIG. 6 illustrates an integrated cooling system for a cluster of parallel electronic boards of the integral cooling system, in accordance with another preferred embodiment of the present invention. In has to be emphasized that other clusters arranged in any other arrangements (not necessarily in parallel) are also included and covered by the scope the present invention. Each board (10, 101, 102) has its own integral reservoirs (see FIG. 1b) and a plurality of feeding slots 32 to provide at least one air passage to the heat-exchanging devices (not seen in this figure) that are assembled above one or more heat-dissipating components 30,30a on board. The supply ports 22 of the boards (10, 101, 102) are fed by main manifold 220 (communicating either with a vacuum source or a pressure source). At least one air passage 22a can be created between two boards. In some embodiments of the present invention a board may include one or more secondary cards 111,112 directly connected tq the main board 10. Secondary cards 111,112 with integral reservoir fluidically communicating with heat-exchanging devices 50 may also be included in the integral cooling system of the present invention. The cards 111,112 may be perpendicular or tilted with respect to the main board (by angle α, shown in the figure). In addition slave cards 121,122 with internal reservoir can also be included in the integral cooling system, directly connected to the integral reservoir of the main boards 10,102 through passages 22c, 22b.

Figure 7:
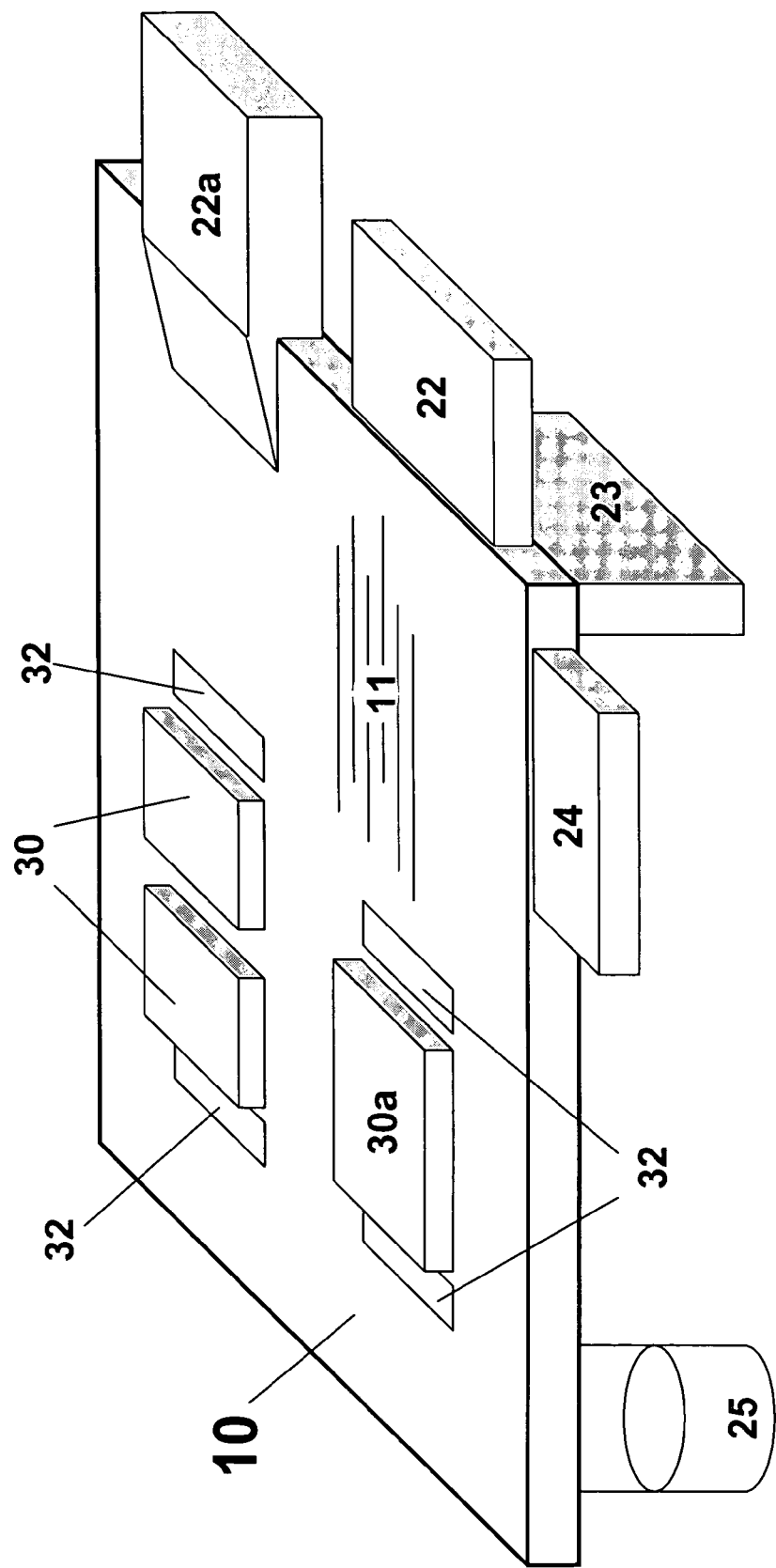
FIG. 7 illustrates an electronic board with an integrated cooling system, in accordance to another preferred embodiment of the present invention, showing some optional supply ports.

FIG. 7 illustrates an integral electronic 10 board of an integrated cooling system, in accordance to another preferred embodiment of the present invention, showing some optional supply-ports. In has to be emphasized that more than one supply-port may be applied for each board. The supply-ports can take various shapes and orientations, some of which are shown in this figure. The supply-ports may be placed parallel to the board (22, 24) or perpendicular (23) to it. It may have a tapering form 22a. It can also have rectangular shape (22,23, 24), annular shape (25) or any other practical shape. In general, the supply-ports may be of any size with respect to the mass flow rate needed for cooling and any practical position and orientation with respect to predetermined overall system design limitations.

Figure 8:
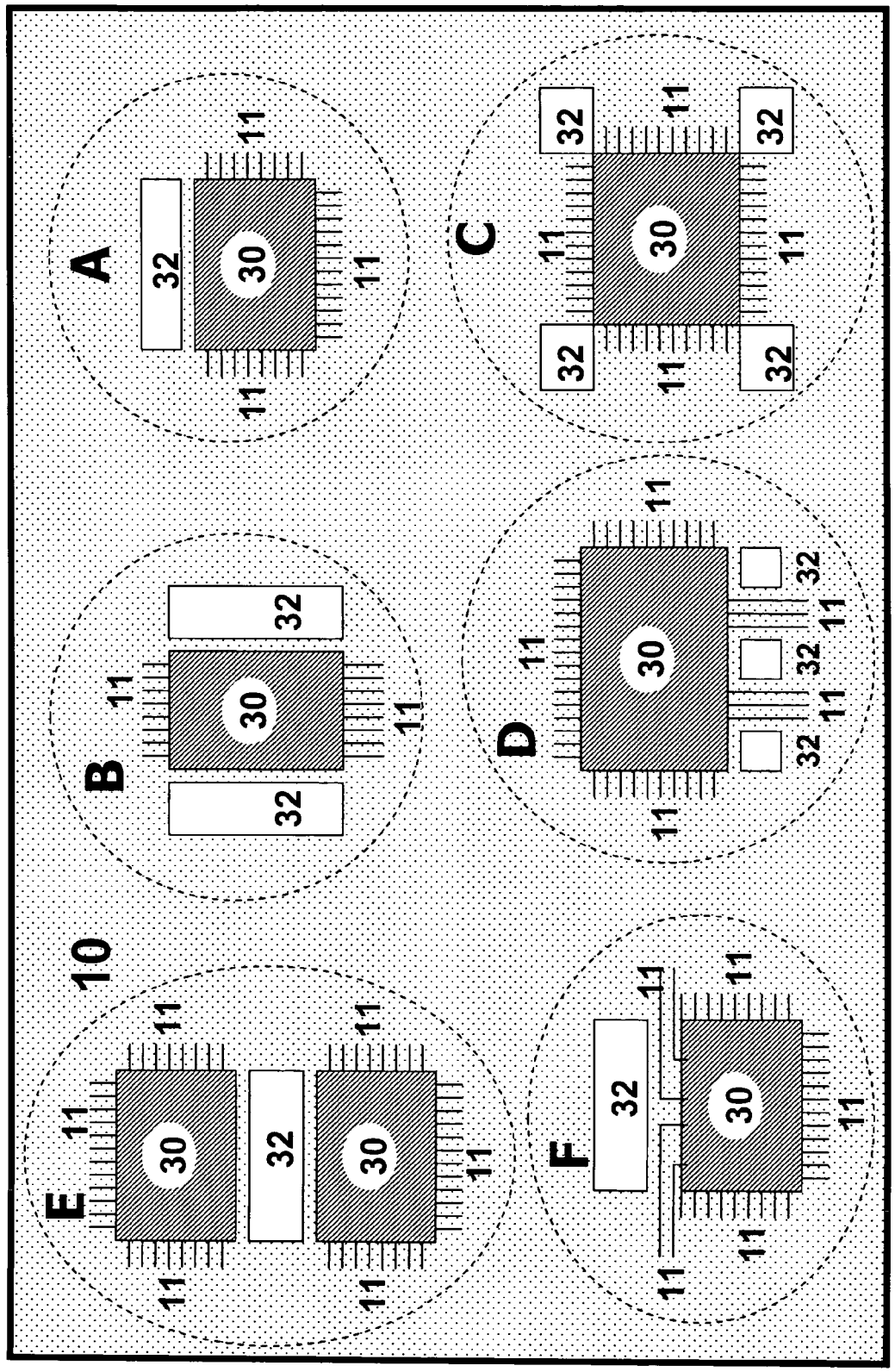
FIG. 8 illustrates some optional designs for feeding-slots to allow connection between the integral reservoir to the heat-exchanging devices mounted on an electronic board with an integrated cooling system, in accordance to another preferred embodiment of the present invention.

FIG. 8 illustrates some examples of optional designs for feeding-slots on an integral electronic board 10 with an integrated cooling system, in accordance to another preferred embodiment of the present invention. The feeding slot are planned to allow air passage from the integral reservoir of 10 to the heat-exchanging devices (not seen) that are assembled over at least part of the heat-dissipating electronic component 30, in particular on the components that generate large amount of heat. In example A one feeding slot 32 is positioned parallel to one side of the electronic component 30, allowing electrically conductive connections 11 of the IEB to run on all other sides of the electronic component.

In example B two feeding slots are provided opposite each other, on either sides of the electronic component. In This configuration it is possible to decrease the working pressure of the cooling system by allotting each slot the task of providing air (or evacuating air) across only a half of the heat-exchange unit. Accordingly, two sides of the electronic component are free for the IEB conductive connections 11.

In example C four feeding slots are provided, located at the corners of the electronic component 30. This allows decreasing working pressure in the system as the pressure drops over a half of the heat-exchange unit, whereas conductive connections 11 may run on all sides of the component. It has to be emphasized here that the heat exchanger device can be larger than the electronic component below it and in such a case heat-spreader is provided. Accordingly the feeding slots are designed with respect to the detailed design of the heat exchanging device.

In example D one feeding slot 32 adjacent the electronic component 30 is divided to several sectors (3 are shown in that example), allowing conductive connections 11 to pass between the slot's sector, and at the same time encircling the component 30 from all sides.

In example E one feeding slot 32 feeds two close heat-exchanging units. This configuration is suitable in particular in case where the two components 30 generate relatively small amount of heat with respect to other components on the board, but is also suitable for crowded boards, when there is little room for cooling slots. Here it has to be emphasized here that one heat-exchanging device can be used to cool two or more neighboring heat-dissipating components.

In example F (similar to A), one feeding slot 32 feeds the electronic component 30, but the feeding slot 32 is located in some distance from component 30, allowing conductive connections 11 to encircle the component 30 from all sides.

Figure 9:
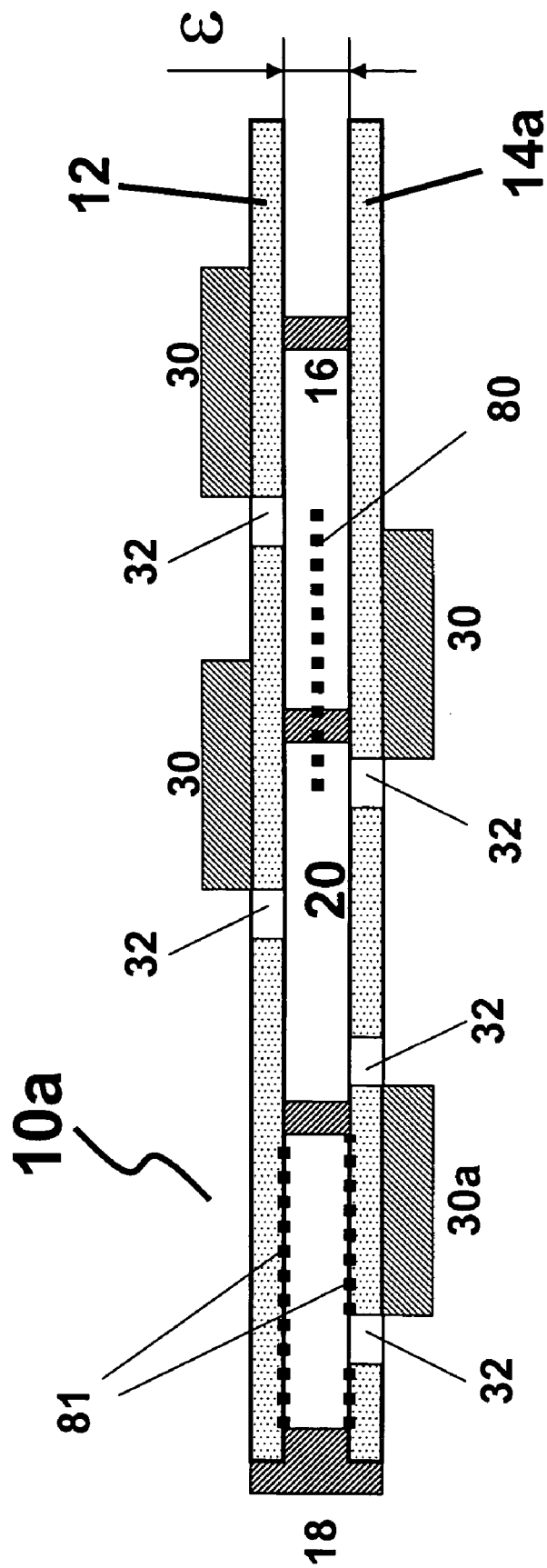
FIG. 9 illustrates a cross-sectional view of a two-layered electronic board (see also FIG. 1b), where both layers are printed circuit boards.

FIG. 9 illustrates (somewhat similar to the embodiment shown in FIG. 1b), a cross-sectional view of another version of an integral electronic board in accordance to another preferred embodiment of the present invention. The board 10a is actually made from two parallel plates, one board 12 being a printed circuit board onto which electronic components are mounted, but unlike the version described in FIG. 1b, the opposite board 14a is also a printed circuit board onto which electronic components are mounted. Accordingly an integral reservoir 20 is created between boards 12 and 14a, designed with feeding slots 32,32a on both boards to support cooling requirement of heat-dissipating electronic components 30,30a. A perforated metal layer 80 or metallic sealing sheets 81 for electromagnetic shielding may be used too.

The optimal design of the integral cooling systems with respect to the present invention is closely related to the pressure drops (or losses), through the integral cooling system where the pressure drop is preferably minimized by the specific design and accordingly the power driving the coolant (such as air) may significantly be reduced. It is recommended to provide uniform pressure at the integral reservoir of the board. On the other hand optimal design means in many cases the reduction of the overall thickness of the integral board thus allowing more compact packaging of the electronic board (hence more performance per system footprint).

Without derogating the generality, typical integral cooling system with respect to the present invention may include several dozens of integral boards 10, or 10a (see FIG. 1b and FIG. 9) as well as secondary and slave boards (see FIG. 6). Each of the integral boards with the internal (vacuum or pressurized air), reservoir maintaining a gap of between 2-12 mm), has at least one side which is a IEB onto which at least one heat-dissipating electronic component is mounted. Typically, up to dozen and even more heat generating components may be mounted on one PCB. Typical dimensions of such electronic components vary from about 10×10 mm, up to 50×50 mm and more. The heat-exchanging device used may be of similar dimensions to the electronic component or larger by a factor of 2-4 or more, with respect to the integral cooling system optimization. The dimensions and the number of feeding slots provided through the board for feeding a specific heat-exchanging device are correlated to the amount heat removal (or the mass flow rate) of that devices where the greater the heat removal task is, the greater is the overall opening area of these feeding slots. The amount of heat generation of a single electronic component can vary from few watts to several hundreds of watts (a 3.2 MHz Xeon processor dissipates up to about 100 watts, as in 2004). Typical figures for the overall heat generation of a single integral board (10 or 10a) are in the range of 100-1000 watts. When the integral reservoir is connected to a vacuum source (see FIG. 2), the vacuum level that drives the air by suction through the heat-exchanging devices would be in the range of between a few millibars and a few dozens millibars below ambient pressure. Alternatively, when the integral reservoir is a connected to pressurized air source (see FIG. 3), the pressure level that drives the air out through the heat-exchanging devices would be in the range of between a few millibars and a few dozens millibars above ambient pressure.

The through flow rate depends on the number of heat dissipating components, and accordingly the integral cooling system is designed. Typical figures for mass flow rate of optimally designed cooling system are about 3-4 grams/sec of air for each 100 watts heat removal but it depends also on operational temperature limitations of the on-board electronic components.

It should be clear that the description of the embodiments and attached Figures set forth in this specification serves only for a better understanding of the invention, without limiting its scope.

It should also be clear that a person skilled in the art, after reading the present specification could make adjustments or amendments to the attached Figures and above described embodiments that would still be covered by the present invention.

The invention claimed is:

1. An integrated electronic board system with integral cooling facility, the system comprising:
at least one integrated electronic board, with a plurality of heat-dissipating electronic components distributed over it, each of the heat dissipating components coupled to a respective one of a plurality of heat-exchanging devices, and one or more slots provided adjacent each of said plurality of heat-dissipating electronic components, each of said one or more slots fluidically communicating with at least one respective heat-exchanging device of said plurality of heat-exchanging devices; and an adjoining cover defining, with said at least one integrated electronic board, a cavity for providing an integral reservoir between said one or more slots and at least one port for connecting to a flow generator for generating a flow of a fluidic coolant through the heat-exchanging device that is coupled to each of said one or more heat dissipating devices.

2. The system of claim 1, wherein the flow generator is a vacuum source that maintains in the cavity pressure that is lower than ambient pressure.

3. The system of claim 1, wherein the flow generator is a pressurized air source that maintains in the cavity pressure above ambient pressure.

4. The system of claim 1, wherein the adjoining cover is an integrated electronic board.

5. The system of claim 1, wherein said at least one integrated electronic board comprises more than one integrated electronic board, and wherein the flow generator is connected to port of each cavity of a plurality of cavities respective to said more than one integrated electronic board.

6. The system of claim 5, wherein the port of each cavity is connected via a shared manifold to the flow generator.

7. The system of claim 1, wherein the heat-exchanging device comprises a heat-conductive body provided with conduits through the body, fluidically communicating with at least one of said one or more slots.

8. The system of claim 7, wherein the conduits are communicating through a manifold with said at least one of said one or more slots.

9. The system of claim 1, wherein at least some of the heat-dissipating electronic components are coupled to the same heat exchanging device.

10. The system of claim 1, wherein at least some of the heat-dissipating electronic components share a single slot of said one or more slots.

11. The system of claim 1, wherein said at least one port is provided on a side wall.

12. The system of claim 1, wherein said at least one port is provided perpendicular to said at least one integrated electronic board.

13. The system of claim 1, wherein more than one of said one or more slots are provided adjacent each of the heat-dissipating electronic components, said more than one slot communicating with the heat-exchanging device coupled to the respective heat-dissipating electronic component.

14. The system of claim 13, wherein more than one of said one or more slots are provided on more than one side of each of the heat-dissipating electronic components.

15. A method of cooling heat-dissipating electronic devices, the method comprising:
providing a system comprising at least one integrated electronic board, with a plurality of heat-dissipating electronic components distributed over it, each of the heat dissipating components coupled to a respective one of a plurality of heat-exchanging devices, and one or more slots provided adjacent each of said plurality of heat-dissipating electronic components, each of said one or more slots fluidically communicating with at least one respective heat-exchanging device of said plurality of heat-exchanging devices;

providing an adjoining cover defining, with said at least one integrated electronic board, a cavity for providing an integral reservoir between said one or more slots and at least one port for connecting to a flow generator for generating a flow of a fluidic coolant through the heat-exchanging device that is coupled to each of said one or more heat dissipating devices; and using the flow generator to drive a fluidic coolant through the heat-exchanging device that is coupled to each of said one or more heat dissipating devices.

16. The method of claim 15, wherein the flow generator is a vacuum source that maintains in the cavity pressure that is lower than ambient pressure.

17. The method of claim 15, wherein the fluidic coolant is air.

18. The method of claim 15, wherein the adjoining cover is an integrated electronic board.

19. The method of claim 15, wherein said at least one integrated electronic board comprises more than one integrated electronic board, and wherein the flow generator is connected to the port of each cavity of a plurality of cavities respective to said more than one integrated electronic board.

20. The method of claim 19, wherein the port of each cavity is connected via a shared manifold to the flow generator.

21. The method of claim 15, wherein the heat-exchanging device comprises a heat-conductive body provided with conduits through the body, fluidically communicating with at least one of said one or more slots.

22. The method of claim 21, wherein the conduits are communicating through a manifold with said at least one of said one or more slots.

23. The method of claim 15, wherein at least some of the heat-dissipating electronic components are coupled to the same heat exchanging device.

24. The method of claim 15, wherein at least some of the heat-dissipating electronic components share a single slot of said one or more slots.

25. The method of claim 15, wherein said at least one port is provided on a side wall.

26. The method of claim 15, wherein said at least one port is provided perpendicular to said at least one integrated electronic board.

27. The method of claim 15, wherein more than one slot are provided adjacent a heat-dissipating electronic component of said heat-dissipating electronic components, all of which are communicating with the heat-exchanging device coupled to the respective heat-dissipating electronic component.

28. The method of claim 27, wherein said more than one of said one or more slots are provided on more than one side of the heat-dissipating electronic component.

* * * * *